US007653206B2

(12) United States Patent
Collins et al.

(10) Patent No.: US 7,653,206 B2
(45) Date of Patent: Jan. 26, 2010

(54) DIGITAL AUDIO DEVICE

(75) Inventors: Gary Collins, Redondo Beach, CA (US); Paul Nielsen, Stamford, CT (US); Kevin Harmon, Mission Viejo, CA (US)

(73) Assignee: Mattel, Inc., El Segundo, CA (US)

( * ) Notice: Subject to any disclaimer, the term of this patent is extended or adjusted under 35 U.S.C. 154(b) by 317 days.

(21) Appl. No.: 10/286,445

(22) Filed: Oct. 31, 2002

(65) Prior Publication Data

US 2003/0220785 A1    Nov. 27, 2003

Related U.S. Application Data

(60) Provisional application No. 60/340,616, filed on Nov. 1, 2001, provisional application No. 60/337,555, filed on Nov. 8, 2001.

(51) Int. Cl.
 *H04R 1/02* (2006.01)
(52) U.S. Cl. .................. 381/334; 439/291; 700/94; 705/51; 705/57; 84/602
(58) Field of Classification Search ............. 381/104, 381/334; 705/51, 57; 700/94; 726/26; 711/164; 84/602; 379/67.1, 68, 75; 439/284, 289, 439/290, 291
 See application file for complete search history.

(56) References Cited

U.S. PATENT DOCUMENTS

| 4,518,827 | A |   | 5/1985 | Sagara |   |
|---|---|---|---|---|---|
| 4,614,144 | A |   | 9/1986 | Sagara et al. |   |
| 4,905,289 | A |   | 2/1990 | Micic et al. |   |
| 5,457,643 | A | * | 10/1995 | Vahey et al. ............... 361/683 |
| 5,459,702 | A |   | 10/1995 | Greenspan |   |
| 5,537,343 | A | * | 7/1996 | Kikinis et al. ............. 361/687 |
| 5,732,324 | A |   | 3/1998 | Rieger, III |   |
| 5,787,399 | A | * | 7/1998 | Lee et al. ................... 704/270 |
| 5,914,941 | A |   | 6/1999 | Janky |   |
| 5,930,758 | A |   | 7/1999 | Nishiguchi et al. |   |
| 5,982,977 | A |   | 11/1999 | Naruse et al. |   |
| 6,041,023 | A | * | 3/2000 | Lakhansingh ............... 369/7 |
| 6,061,306 | A |   | 5/2000 | Buchheim |   |
| 6,076,063 | A |   | 6/2000 | Unno et al. |   |

(Continued)

FOREIGN PATENT DOCUMENTS

CN    1161620 A    10/1997

(Continued)

OTHER PUBLICATIONS

A European Office Action from corresponding European Application No. 02786648.2, mailed on Jun. 16, 2008.

*Primary Examiner*—Vivian Chin
*Assistant Examiner*—Jason R Kurr
(74) *Attorney, Agent, or Firm*—Kolisch Hartwell, P.C.

(57) ABSTRACT

A digital audio device. According to one aspect of the invention, the device includes a memory and an analog input system configured to record analog audio signals to the memory as digital audio data. The device further includes a digital input configured to download digital audio data to the memory, as well as an analog output system configured to generate analog playback signals decoded from digital audio data stored in the memory. Furthermore, the device includes a digital output configured to upload digital audio data from the memory.

24 Claims, 3 Drawing Sheets

U.S. PATENT DOCUMENTS

| | | | |
|---|---|---|---|
| 6,230,047 B1 * | 5/2001 | McHugh | 600/519 |
| 6,252,830 B1 * | 6/2001 | Hsu | 704/500 |
| 6,282,154 B1 * | 8/2001 | Webb | 704/275 |
| 6,286,063 B1 | 9/2001 | Bolleman et al. | |
| 6,300,976 B1 | 10/2001 | Fukuoka | |
| 6,353,169 B1 * | 3/2002 | Juszkiewicz et al. | 84/600 |
| 6,367,019 B1 * | 4/2002 | Ansell et al. | 726/26 |
| 6,372,974 B1 * | 4/2002 | Gross et al. | 84/609 |
| 6,446,177 B1 * | 9/2002 | Tanaka et al. | 711/163 |
| 6,581,160 B1 * | 6/2003 | Harada et al. | 713/169 |
| 6,606,281 B2 * | 8/2003 | Cowgill et al. | 369/11 |
| 6,647,496 B1 * | 11/2003 | Tagawa et al. | 713/193 |
| 6,721,709 B1 * | 4/2004 | Yoo et al. | 704/500 |
| 6,952,713 B1 * | 10/2005 | Van Gestel et al. | 709/202 |
| 2002/0165825 A1 * | 11/2002 | Matsushima et al. | 705/51 |
| 2003/0040276 A1 * | 2/2003 | Corn | 455/42 |
| 2003/0163823 A1 * | 8/2003 | Logan et al. | 725/89 |
| 2003/0193693 A1 * | 10/2003 | Morohashi | 358/3.24 |

FOREIGN PATENT DOCUMENTS

| | | |
|---|---|---|
| EP | 786774 A2 | 7/1997 |
| EP | 957489 A1 | 11/1999 |

* cited by examiner

DIGITAL AUDIO DEVICE

CROSS-REFERENCE TO RELATED APPLICATIONS

This application is based on and claims priority under 35 U.S.C. §119 from the following co-pending provisional patent applications, which are incorporated herein by this reference, in their entirety and for all purposes: PORTABLE DIGITAL DEVICE FOR RECORDING, SHARING, AND PLAYING AUDIO CONTENT, Ser. No. 60/340,616, filed Nov. 1, 2001; and PORTABLE DIGITAL DEVICE FOR RECORDING, SHARING, AND PLAYING AUDIO CONTENT, Ser. No. 60/337,555, filed Nov. 8, 2001.

TECHNICAL FIELD

The present invention relates to a digital audio device, and more particularly, to a digital audio device used to record, share, and play audio content.

BACKGROUND OF THE INVENTION

It has become a common practice to store audio content in a portable format so that individuals may enjoy audio content regardless of their location. Portable audio players such as portable radios, portable audio cassette players, portable compact disk players, and portable minidisk players have been used to achieve this purpose.

Some portable audio devices use digital memory to store the audio content in an encoded digital format. Known devices that use digital memory to store audio content include those disclosed in U.S. Pat. Nos. 4,518,827; 4,614,144; 4,905,289; 5,914,941; 5,930,758; and 6,076,063, the disclosures of which are incorporated by reference in their entirety for all purposes.

SUMMARY OF THE INVENTION

A digital audio device is provided. According to one aspect of the invention, the device includes a memory and an analog input system configured to record analog audio signals to the memory as digital audio data. The device further includes a digital input configured to download digital audio data to the memory, as well as an analog output system configured to generate analog playback signals decoded from digital audio data stored in the memory. Furthermore, the device includes a digital output configured to upload digital audio data from the memory.

DETAILED DESCRIPTION OF THE INVENTION

Figure 1:
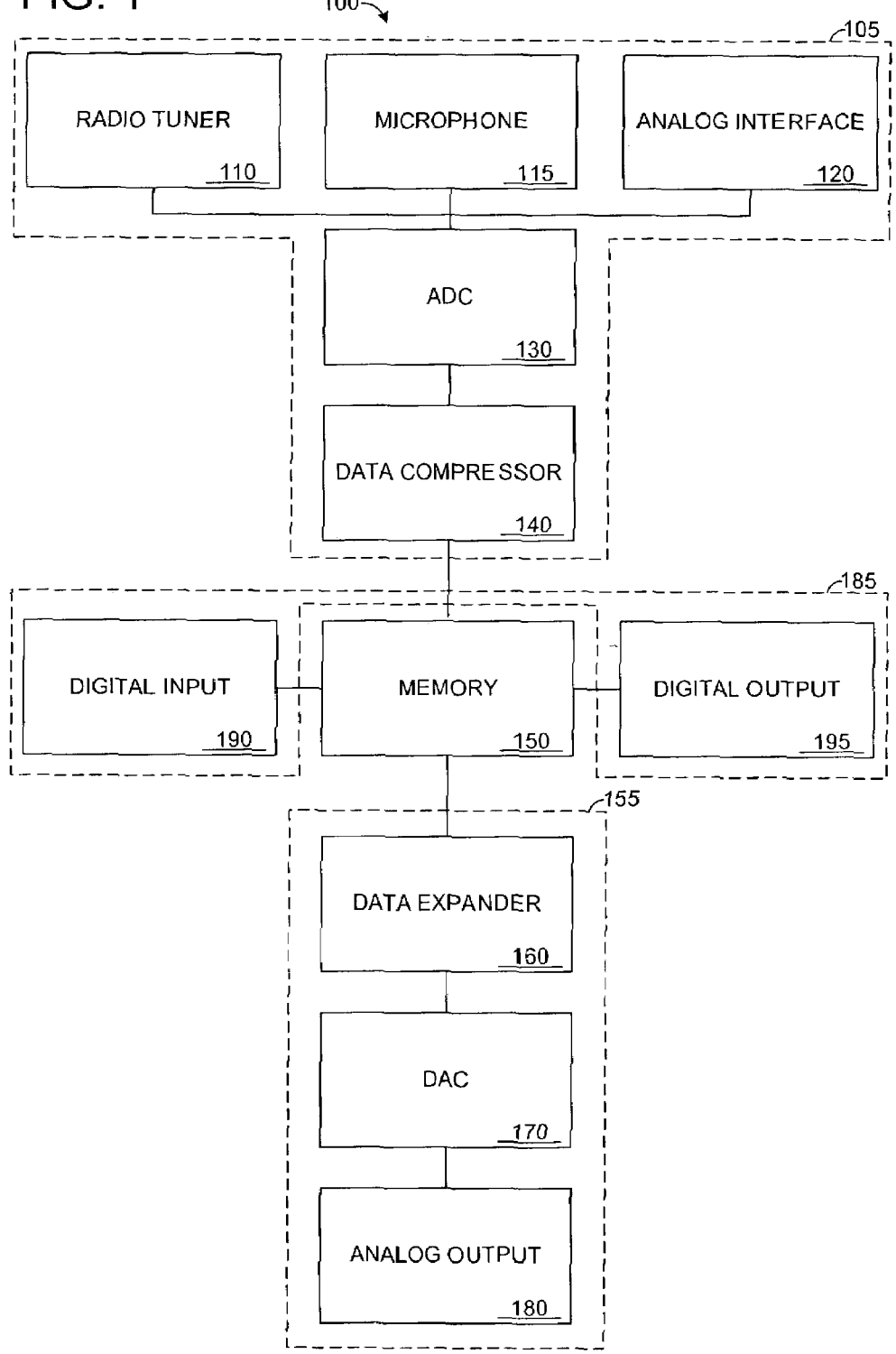
FIG. 1 is a schematic view of a digital device according to an embodiment of the present invention.

FIG. 1 schematically depicts an embodiment of a digital device 100 capable of recording, sharing, and playing audio content in accordance with an embodiment of the present invention. As described in more detail below, the digital device is capable of receiving analog audio signals from a variety of sources, and the device is capable of storing the received audio signals in memory as digital audio data. In some embodiments, the audio signals may be digitally compressed so that the resulting digital audio data occupies less memory. According to some embodiments of the present invention, digital audio data may be shared amongst two or more devices, such as by uploading and downloading the data between the devices. Whether initially received as analog audio signals or shared digital audio data, the device may present the stored content from memory as audio playback signals, which may be played through speakers. In some embodiments, the device may implement a copyright management scheme.

As shown, digital device 100 includes an analog input system 105, which includes a radio tuner 110, microphone 115, analog interface 120, analog-to-digital converter (ADC) 130, and data compressor 140. The digital device further includes digital memory 150, as well as an analog output system 155, which includes data expander 160, digital-to-analog converter (DAC) 170, and analog output 180. Furthermore, the digital device includes a digital sharing system 185 for sharing audio tracks in the form of digital audio data. The digital sharing system includes digital input 190, and digital output 195. It should be understood that the above configuration is provided as an example, and digital audio devices may be differently configured while remaining within the scope of the invention. For example, the analog input system may include an analog interface but not a microphone or radio tuner.

Radio tuner 110 may be used to acquire and receive audio signals. The tuner may be configured to receive amplitude modulated signals, frequency modulated signals, or virtually any other type of radio signal. In addition, radio tuner 110 may be configured for use with other signal transmission technologies such as satellite, infrared, or other wireless transmissions. The radio tuner may include a digital tuning mechanism or an analog tuning mechanism for selecting a desired frequency. The radio tuner may also include one or more programmable presets that may be used to easily select a specific frequency. Furthermore, it is within the scope of the invention to include more than one radio tuner in the digital device. In such embodiments, one tuner may be used to present live content via the analog output system while the other tuner is used to record content to memory for subsequent playback. Similarly, the radio tuner may be used to buffer live content, thus allowing a listener to repeat selected portions of a live broadcast while the broadcast is continually buffered and made available for listening. In the illustrated embodiment, radio tuner 110 is operatively coupled to ADC 130, and is configured to transfer received signals to the ADC.

Microphone 115 may be used to input live audio such as spoken messages, environmental noises, or musical performances. The sound waves of such audio may be converted into an analog signal. The microphone may be commonly housed with the remainder of the digital device, or portions of the digital device. In some embodiments, the microphone may be an external peripheral, which may be selectively coupled to the digital device. The microphone may be used to layer tracks onto another audio track. In this manner, karaoke may be performed and/or recorded. As shown, microphone 115 is operatively coupled to the ADC, and is configured to transfer signals to the ADC.

Analog interface 120 is configured to receive analog audio content via physical transmission modes. In some embodiments, analog interface 120 may include a female input jack adapted to receive a complimentarily configured male plug, which may transfer analog signals to the female jack. For example, the analog interface may be configured to transfer signals via electric current. Suitable interfaces include, but are not limited to, a stereo headphone jack and an RCA jack. As an example, an external device, such as a compact disk player, cassette player, digital versatile disk player, or similar device, may be connected via a headphone jack to analog interface 120 of the digital device. In this manner, songs from the external device may be downloaded to the memory of the digital device, as explained in detail below. The analog interface may be adapted to communicate with a variety of corresponding interfaces from other devices. Furthermore, the interface may be designed to be compatible with industry standards, or as a proprietary input that prevents input from unwanted sources. In the illustrated embodiment, analog interface 120 passes analog audio signals to ADC 130.

ADC 130 receives a continuously variable analog input signal and converts the signal into binary digital data. The invention may use any suitable technique for making the conversion. In some embodiments, adaptive differential pulse code modulation is used to convert the analog signal into digital data. ADPCM is a technique for converting an analog signal into binary data by taking frequent samples of the analog signal and expressing the value of the sampled sound modulation in binary terms. It is within the scope of the invention to take such samples at a variety of frequencies, and the bit depth of each sample may also be variably selected. Furthermore, formats other than a binary format may be used in some embodiments. In the illustrated embodiment, the converted digital data is sent to data compressor 140.

Data compressor 140 typically receives digital data from ADC 130 and/or direct digital input 190. Data compressor 140 may use any suitable technique for reducing the amount of memory required to hold the digital data. Suitable techniques include utilizing psychoacoustic principals to eliminate data portions that represent sounds a human listener is incapable of detecting. Examples of data which may be eliminated include data corresponding to all sound above and below specified frequency levels. For instance, the human ear is typically capable of detecting sounds between approximately 20 Hz and 20,000 Hz. Therefore, one possible data compression technique is to eliminate all data corresponding to sounds below 20 Hz and above 20,000 Hz. The present invention may use other frequency cut-off levels depending on the amount of compression desired and the accuracy of the resulting signal that is desired.

In addition to eliminating entire frequency components, data representing certain sounds may be eliminated. For instance, if the audio signal includes data that represents a high energy sound that will be played at the same time as a low energy sound, the data representing the low energy sound may be eliminated because a human listener would not be able to perceive the low energy sound at the same time as the high energy sound. These and other psychoacoustic principals are well known, and the present invention is capable of implementing any such data compression technique. In addition to psychoacoustic data compression, the present invention is capable of implementing techniques such as Huffman coding as well as other known coding techniques. The invention is also capable of implementing new data compression techniques as they become available.

Data compressor 140 may use the same compression technique with all digital data or alternatively may selectively use particular compression techniques depending on the digital data. In some embodiments, data compressor 140 may be left out of the device, thus leaving the digital data uncompressed. When present, the data compressor may be selectively disengaged to enable uncompressed recording. The data compressor, alone or in combination with other aspects of the digital device, typically will take the form of a digital signal processor, application specific integrated circuit, and/or programmable processor. In the illustrated embodiment, data compressor 140 passes the compressed digital data to memory 150.

Memory 150 may be any suitable memory capable of storing digital data, including, but not limited to, digital audio data. Preferably, memory 150 is nonvolatile. Examples of nonvolatile memory include magnetic storage media such as floppy disks or hard disks; optical storage media such as compact disks or digital versatile disks; and semiconductor memory such as Flash memory, a form of electrically erasable programmable read-only memory. The above listed memory technologies are examples of what may be used in memory 150 and are not meant to be limiting. Embodiments of the present invention are capable of utilizing any known digital memory technology and of implementing any new digital memory technology as it becomes available.

In addition to utilizing a single memory technology, any combination of digital memory technologies may be utilized in digital device 100. For example, a large capacity nonvolatile storage media such as a hard disk may be used to permanently store digital audio data while a volatile solid state memory cache, such as dynamic random access memory, is used to buffer the digital audio data when the data is passed from memory. Buffering the digital audio data into a solid state memory may prevent audio playback interruptions if the device moves while operating. Using a buffer also decreases the frequency the hard drive must be accessed, which in turn decreases power drain and increases battery life. Memory 150, or portions of it, may be a permanently fixed memory and/or a removable memory media. The memory may receive data from data compressor 140, ADC 130, and/or from digital input 190. In the illustrated embodiment, digital audio data is passed from memory 150 to data expander 160 for playback and/or direct digital output 195 for sharing.

Data expander 160 typically receives digital audio data from memory 150. The data is expanded into expanded digital data that corresponds to audio that is substantially equivalent to the original uncompressed data. Data expander 160 may perform the same expansion technique on all compressed digital data or alternatively may selectively expand the compressed digital data depending on how the data was compressed. For example, data expander 160 may detect what compression technique produced the compressed data and select an inverse compression technique to return the data to an uncompressed form. Such selection may be accomplished by attaching compression identifier tags into the data and instructing the data expander to detect the compression identifier tags and select an expansion technique according to the detection. The invention is capable of using other methods of selecting the expansion technique and the above is meant to be a non-limiting example. In the illustrated embodiment, the expanded data is passed from data expander 160 to DAC 170.

DAC 170 receives expanded data in the form of binary digital data and converts the data into a continuously variable analog playback signal. The invention may use any suitable technique for making the conversion. The resulting analog playback signal preferably is substantially identical to the original input analog signal from the perspective of a human listener. If psychoacoustic principals are used to compress the input signal, the playback signal may not be identical to the original input analog signal although it may sound substantially identical to a human listener. If a high degree of compression is used, the playback signal may not be substantially identical to the original signal because of data lost in the compression. These and other differences between input and playback signals resulting from analog-to-digital conversion, compression, expansion, and/or digital-to-analog conversion are an acceptable aspect of the present invention. In the illustrated embodiment, the converted analog playback signal is sent to analog output 180.

Analog output 180 typically receives an analog playback signal from DAC 170, and in some embodiments, directly from radio tuner 110, microphone 115, and/or analog interface 120. The analog output may include a female output jack adapted to receive a complimentarily configured male plug. Such a female output jack may be adapted to receive a variety of male plugs and may be selected to be compatible with industry standards or alternatively as a proprietary output jack that prevents unwanted output. The analog output is configured to facilitate audio playback, such as via a sound transducer. The sound transducer may be included in digital device 100 or may be a separate component. The analog playback signal may be transferred from the analog output as a line level unamplified signal, which may be amplified before being directed to a sound transducer. For instance, the analog playback signal may be amplified by a stereo headphone amplifier included in device 100 and/or by a high power external stereo amplifier. In some embodiments, the analog output may include an amplifier, and the analog playback signal may be transferred as an amplified signal.

Analog output 180 may include more than one female output jack or other appropriate physical interface. Multiple output jacks allow multiple sound transducers to be connected to and used with digital device 100. For instance, two separate headphone units may be connected to the device at the same time, thus allowing two separate individuals to privately listen to audio content. In some embodiments, each listener may listen to content different from the other listener. The analog output may alternatively or additionally include a wireless signal transmitter (not shown), which may include an antenna incorporated into digital device 100. The wireless transmitter may be used to send the audio playback signal to another device for audio playback. For instance, the wireless transmitter may produce an FM signal that may be received and played by any FM radio.

As illustrated in FIG. 1, digital device 100 may also include direct digital input 190 for downloading digital data. Such digital data may be downloaded from another digital device, a network, and/or other appropriate sources. The data may be received via electrical, optical, wireless, and/or any other suitable transmission mode. Examples of known protocols for digital transmission of data include but are not limited to IEEE 1394, USB, and IEEE 802.11b. In some embodiments, direct digital input 190 may be configured to receive uncompressed digital audio data. The uncompressed digital audio data may be passed to data compressor 130 and processed as described in the above paragraphs. Similarly, the digital input may be configured to receive compressed digital audio data that is passed to memory 170 and processed as described in the above paragraphs. Such an arrangement allows the digital device to receive (download) music or other data from external sources.

Digital device 100 is capable of receiving an analog input stream via radio tuner 110, microphone 115, and/or analog interface 120. As described above, the analog input stream may be converted into digital audio data, which may be stored in memory 170. The digital audio data may be expanded and converted to an analog playback signal for audio playback. The digital audio data may also be uploaded out of digital device 100 through direct digital output 195. The data may be transferred via electrical, optical, wireless, and/or any other suitable transmission mode. Examples of known protocols for digital transmission of data include but are not limited to IEEE 1394, USB, and IEEE 802.11b. The transferred digital data may then be received by a direct digital input of another digital device (not shown) and stored in that device's memory. In this manner, data representing songs and/or other content may be shared between digital devices.

Digital device 100 is capable of considering the copyright status of audio content and restricting copying based on the consideration. For instance, when digital device 100 receives an input analog signal via analog interface 120, it may check for copyright status information. The device may adhere to a copyright management scheme, and thus restrict copying of data depending on the copyright status and/or assigned codes associated with the data to be copied. For instance, depending on the input mode, the device may allow each recorded song to be copied a specified number of times. For example, the device may allow songs recorded from microphone 115 to be copied an unlimited number of times, songs recorded from radio tuner 110 to be copied only once, and songs recorded from direct digital input to not be copied at all.

To implement a copyright management scheme, the device may associate one of a plurality of assigned codes with digital audio data. For example, a restriction code may be assigned to digital audio data to allow only first generation copies of the data to be made. In other words, a copy may be made from a first device to a second device, but further copies could not be made from the second device to any other device. A prevention code may be assigned to digital audio data to prevent any copies of that data from being shared. Other codes are also within the scope of the invention, and may be used to implement a particular copyright management scheme. Furthermore, codes may be changed as data is transferred from one device to another. For example, a restriction code may be converted to a prevention code when a first device shares digital audio content with a second device.

It is understood that device 100 may include one or more components for carrying out the recording, sharing, and playing capabilities described above. For instance, a single component may include one or more of radio tuner 110, analog interface 120, ADC 130, data compressor 140, memory 150, data expander 160, DAC 170, analog output 180, direct digital input 190, and direct digital output 195. Similarly, radio tuner 110, analog interface 120, ADC 130, data compressor 140, memory 150, data expander 160, DAC 170, analog output 180, direct digital input 190, and direct digital output 195 may each be separate components or a combination of multiple components. The exact component configuration may be selected according to price, size, heat dissipation, availability, design ease, and/or other factors.

Figure 2:
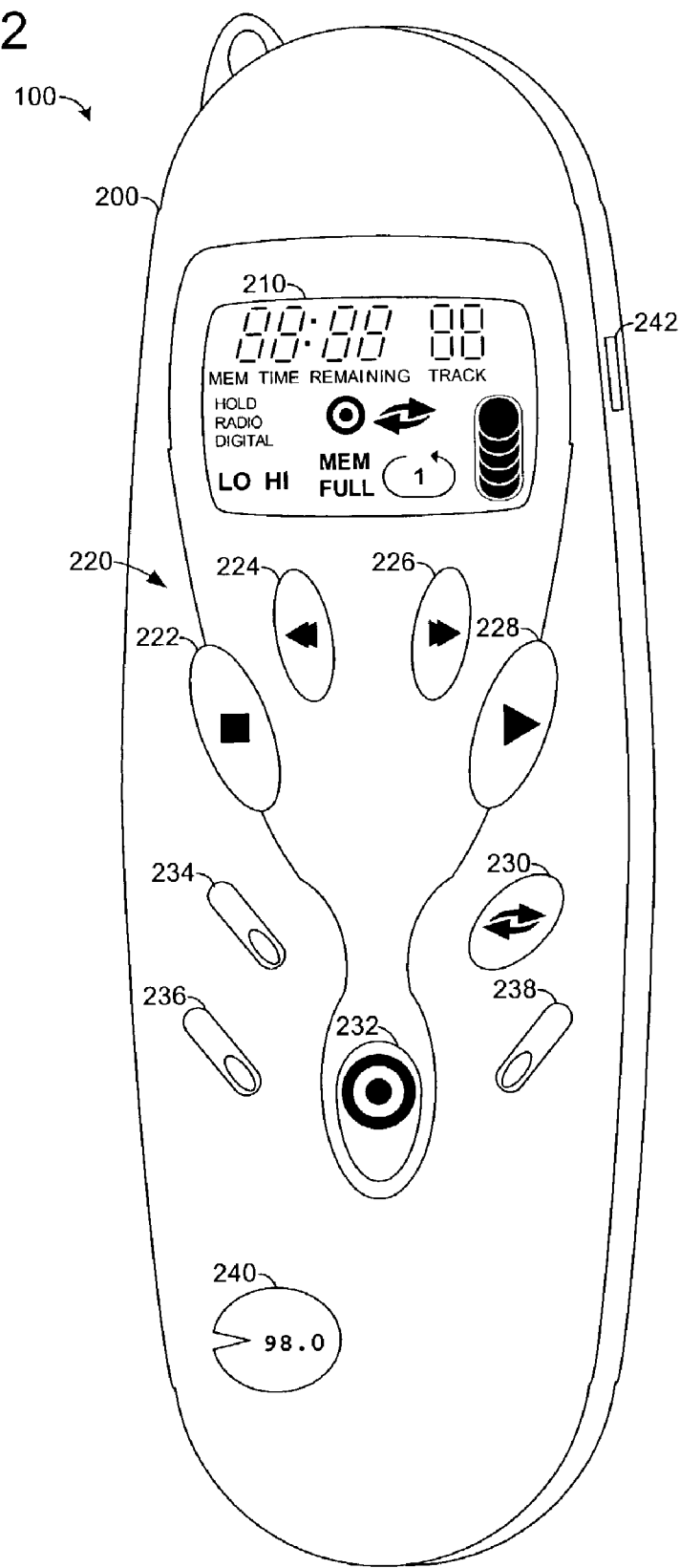
FIG. 2 is a plan view of the digital device of FIG. 1.

FIG. 2 shows a plan view of digital device 100. As shown, the digital device includes a body 200, which is configured to house the components discussed above with reference to FIG. 1. As shown, the body may be dimensioned for portable use; having a relatively small size that may fit in a pocket, and having controls that may be easily used with a single hand that is holding the device. For example, the device may be less than approximately 6 inches tall, 4 inches wide, and 2 inches deep; and more preferably, less than approximately 4 inches tall, 3 inches wide, and 1 inch deep. The digital device also includes a display 210 for presenting information to a user. For example, the display may be configured to present a song track number, battery charge level, operating mode, device setting, and/or other information. In some embodiments, the display includes a liquid crystal display. It should be understood that information may alternatively and/or additionally be presented to the user without the use of a conventional display. For example, various lights (not shown) may be selectively lit to convey information to a user. Furthermore, sounds may be produced to present information to a user.

The digital device further includes various manipulable controls 220 configured to allow a user to control operation of the device, such as stop 222, previous track 224, next track 226, play 228, share 230, and record 232 control buttons. The device also includes mode 234, power 236, and sampling 238 control switches, as well as a frequency selection dial 240 and volume control dial 242. Of course, the display and controls may be particularly configured to correspond to the functionality of a particular embodiment, and the above is provided as an illustrative example. Other configurations are within the scope of the invention. In some embodiments, manipulable controls may be incorporated into a touch-screen display, the device may utilize the microphone to receive voice-actuated commands, and/or other control mechanisms may be utilized.

Figure 3:
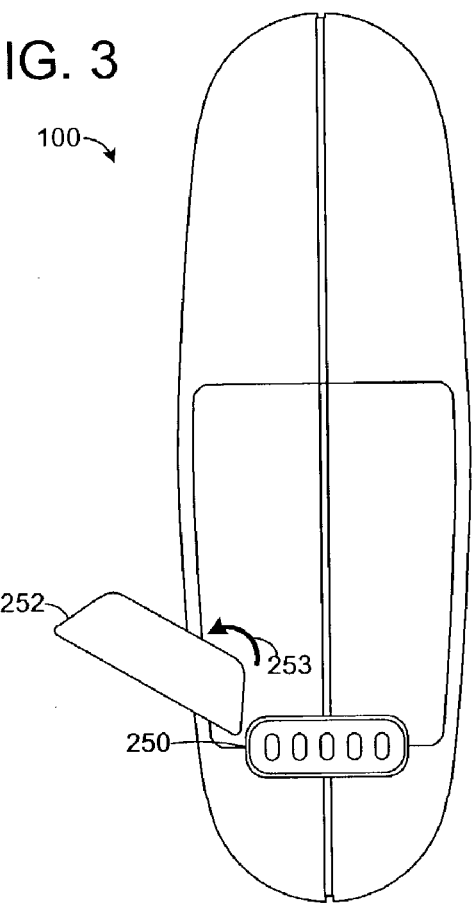
FIG. 3 is a back plan view of the digital device of FIG. 1.

As shown in FIG. 3, device 100 includes a trade connector 250, which is configured to allow the sharing system of the device to interface with another device so that digital information, including recorded audio, may be exchanged between the devices. Digital device 100 also include a trade door 252, configured to cover and protect the trade connector when the trade connector is not being used. As indicated by arrow 253, trade door 252 is configured to selectively expose the trade connector, so that the trade connector may interface with a complementarily configured trade connector on another device, for instance.

Figure 4:
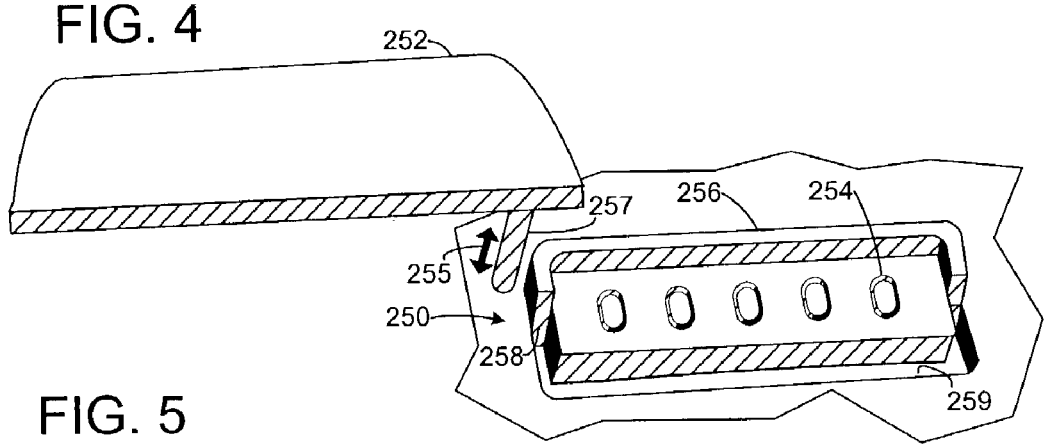
FIG. 4 is a three-dimensional view of a trade connector of the digital device of FIG. 1.

FIG. 4 shows a more detailed view of trade connector 250 and trade door 252. Trade connector 250 includes a plurality of contacts 254 that are individually configured to establish a communication path with a similar contact of another device. Such a communication path, individually or in combination with similar communication paths, may be used to transfer digital data from one device to another. The individual contacts may be configured to transfer digital data via electrical signals, optical signals, or other suitable transfer modes. As indicated by arrow 255, the trade door may be configured to be selectively raised and lowered to facilitate opening and closing the trade door. When raised, the trade door may rotate about a pivot 257; when lowered, the trade door may fit next to the trade connector, providing protection to the trade connector.

Trade connector 250 includes a mating structure 256 configured to physically align device 100 in a fixed position relative to another device. As shown, mating structure 256 includes a raised wall 258 running around a portion of the perimeter of the trade connector and a recessed trough 259 running around the remainder of the perimeter of the trade connector. Raised wall 258 is designed to complement a recessed trough on another device while recessed trough 259 is designed to complement a raised wall on another device. The raised wall of one device may be inserted into the recessed trough of the other device and vice versa, thus aligning the devices in a fixed position relative to one another. When the two devices are aligned, the mating structure of each device cooperates with the mating structure of the other device to facilitate a lock between the devices. The above is provided only as one example of the types of mating structures that may be used. It is within the scope of the invention to alternatively or additionally design trade connector 250 with other mating structures configured to facilitate aligning device 100 in a fixed position relative to another device. Suitable structures may include snaps or other physical connectors designed to create a releasable physical joint. The trade connector may also utilize other connection mechanisms, such as magnetism, for aligning trade connectors.

Figure 5:
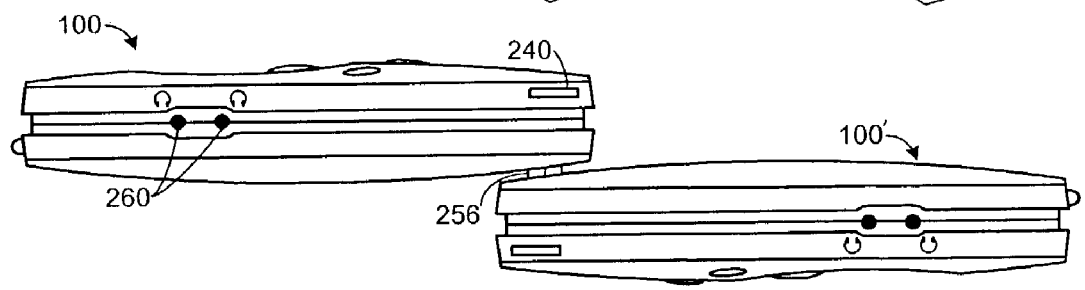
FIG. 5 is an elevation view of two digital devices mated together to share digital data.

FIG. 5 shows device 100 mated with a complementarily configured device 100'. As shown, mating structure 256 of device 100 is temporarily locked with a mating structure of device 100'. Trade Door 252 of device 100, as well as a trade door of device 100', is opened and positioned on the hidden side of the illustrated view, facilitating mating of the two devices. The devices are aligned in a fixed position relative to one another. Thus, contacts of the trade connectors may properly communicate with one another, and data may be transferred from one device to another.

As illustrated, the trade connector is located at the back of the digital audio device. When mated with another digital audio device, the front and sides of digital audio device 100 remain accessible, as does the majority of the back of the device. Therefore, the various controls located at the front of the device may be operated, and the display may be viewed. It is within the scope of the invention to position the trade connector at different locations. In some embodiments, the device may include an extendable trade connector configured to extend from the device to mate with a complementarily configured trade connector.

Mating structure 256 facilitates communication between device 100 and another device without requiring additional structure, such as a cable. Because the mating structure physically aligns one device to another, a variety of communication mechanisms may be used, including communication mechanisms that require precise alignment of complementary parts, for example to create a charge path through which a signal may travel. The trade connector may be designed to prevent nonconforming interfaces from communicating with the trade connector. Therefore, sharing with nonconforming devices may be limited.

Although shown with a physical trade connector, it should be understood that the digital sharing system may implement wireless trading via infrared or radio transfer, as well as other suitable data exchange techniques. Such embodiments may include mating structures to facilitate aligning devices with one another, or such devices may be designed without mating structures.

As shown in FIG. 5, device 100 also includes dual headphone jacks 260, which are configured to output an analog signal that may be supplied to a sound transducer, such as a headphone unit, or other audio device. In this manner, the device may play audio. Some embodiments of the present invention may alternatively include a single headphone jack, or more than two headphone jacks. It is also within the scope of the invention to additionally or alternatively include another interface for operatively coupling a sound transducer to device 100.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

What is claimed is:

1. A digital audio device, comprising:
a memory;

an analog input system configured to record analog audio signals to the memory as digital audio data;

a digital input configured to download digital audio data, through digital data transmission, to the memory;

an analog output system configured to generate analog playback signals decoded from digital audio data stored in the memory;

a digital output configured to upload digital audio data, through digital data transmission, from the memory; and a trade connector including a contact configured to mate and cooperate with a complementarily configured and structurally identical contact on a second digital audio device having a structural configuration substantially identical to the digital audio device.

2. The digital audio device of claim 1, wherein the memory includes semiconductor memory.

3. The digital audio device of claim 1, wherein the memory includes a nonvolatile memory portion and a volatile buffer memory portion.

4. The digital audio device of claim 1, wherein the analog input system includes a radio tuner configured to receive the analog audio signals.

5. The digital audio device of claim 1, wherein the analog input system includes a microphone configured to convert sound energy into the analog audio signals.

6. The digital audio device of claim 1, wherein the analog input system includes an analog interface configured to receive the analog audio signals.

7. The digital audio device of claim 1, wherein the analog input system includes an analog-to-digital converter.

8. The digital audio device of claim 1, wherein the analog input system includes a data compressor.

9. The digital audio device of claim 1, wherein the analog input system is further configured to selectively transfer the analog audio signals directly to the analog output system.

10. The digital audio device of claim 1, wherein the analog output system includes a data expander.

11. The digital audio device of claim 1, wherein the analog output system includes a digital-to-analog converter.

12. The digital audio device of claim 1, wherein the analog output system includes a signal amplifier.

13. The digital audio device of claim 1, wherein the analog output system includes a sound transducer configured to convert the generated analog playback signals into sound energy.

14. The digital audio device of claim 1, wherein the device is configured to adhere to a copyright management scheme.

15. The digital audio device of claim 14, wherein the digital output is configured to prohibit sharing data associated with a prevention code.

16. The digital audio device of claim 14, wherein the digital input is configured to convert a restriction code associated with digital audio data to a prevention code when the digital audio data is downloaded, through digital data transmission, from another device.

17. The digital audio device of claim 1, wherein the trade connector is configured to align the digital audio device in a fixed position relative to the second digital audio device.

18. The digital audio device of claim 17, wherein the cooperating contacts of the digital audio devices establish a communication path for sharing digital audio data through digital data transmission between the digital audio devices.

19. The digital audio device of claim 1, further comprising:
a radio tuner configured to receive radio signals corresponding to an audio track and a sharing system;

wherein the memory is configured to store the audio track as digital audio data; and wherein the sharing system is configured to share the stored digital audio data with another such radio device through digital data transmission between the radio devices.

20. A portable digital audio device, comprising:

a memory;

an analog input system configured to record analog audio signal to the memory as digital audio data and associate said recorded digital audio data with a restriction code;

a digital input system configured to download digital audio data, through digital data transmission, to the memory, and associate said downloaded digital audio data with a prevention code;

an analog output system configured to generate analog playback signals decoded from digital audio data stored in the memory;

a digital output system configured to upload digital audio data with an associated restriction code from the memory to another device through digital data transmission between the devices; and a trade connector including a contact configured to mate and cooperate with a complementarily configured and structurally identical contact on a second digital audio device having a structural configuration substantially identical to the digital audio device.

21. digital audio device of claim 20, wherein digital audio data is uploaded to the other device with an associated prevention code to prevent further sharing from the other device.

22. The digital audio device of claim 20, wherein upon uploading digital audio data associated with a restriction code, the digital output system is configured to convert the restriction code to a prevention code to prevent further uploading from the digital audio device.

23. A portable digital audio device, comprising:

an analog interface configured to receive analog audio signals;

an analog-to-digital converter configured to convert the analog audio signals into uncompressed digital audio data;

a data compressor configured to convert the uncompressed digital audio data into compressed digital audio data;

a semiconductor memory configured to store compressed digital audio data;

a data expander configured to convert the compressed digital audio data into expanded digital audio data;

a digital-to-analog converter configured to convert the expanded digital audio data into an analog playback signal;

a digital sharing system configured to share compressed digital audio data with another such portable digital audio device through digital data transmission between the devices, wherein the digital sharing system includes at least a digital input and a digital output; and a trade connector including a contact configured to mate and cooperate with a complementarily configured and structurally identical contact on a second digital audio device having a structural configuration substantially identical to the digital audio device.

24. The digital audio device of claim 23, wherein the digital output is configured to prohibit sharing digital audio data associated with a prevention code.

* * * * *

UNITED STATES PATENT AND TRADEMARK OFFICE
CERTIFICATE OF CORRECTION

PATENT NO. : 7,653,206 B2 Page 1 of 1
APPLICATION NO. : 10/286445
DATED : January 26, 2010
INVENTOR(S) : Collins et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 673 days.

Signed and Sealed this

Twenty-third Day of November, 2010

David J. Kappos
*Director of the United States Patent and Trademark Office*